United States Patent
Tsuji

(10) Patent No.: US 9,300,115 B2
(45) Date of Patent: Mar. 29, 2016

(54) QUANTUM CASCADE LASER

(71) Applicant: SUMITOMO ELECTRIC INDUSTRIES, LTD., Osaka (JP)

(72) Inventor: Yukihiro Tsuji, Kawasaki (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/726,091

(22) Filed: May 29, 2015

(65) Prior Publication Data

US 2015/0357794 A1 Dec. 10, 2015

(30) Foreign Application Priority Data

Jun. 5, 2014 (JP) .................................. 2014-116710

(51) Int. Cl.

| H01S 5/34 | (2006.01) |
|---|---|
| H01S 5/343 | (2006.01) |
| H01S 5/22 | (2006.01) |
| H01S 5/125 | (2006.01) |

(52) U.S. Cl.
CPC .............. *H01S 5/3402* (2013.01); *H01S 5/125* (2013.01); *H01S 5/22* (2013.01); *H01S 5/34313* (2013.01)

(58) Field of Classification Search
CPC ... H01S 5/3402; H01S 5/125; H01S 5/34313; H01S 5/22
See application file for complete search history.

(56) References Cited

U.S. PATENT DOCUMENTS

| 2008/0056322 A1* | 3/2008 | Masui | B82Y 20/00 372/45.012 |
| 2010/0103963 A1* | 4/2010 | Fujiwara | B82Y 20/00 372/20 |
| 2015/0249320 A1* | 9/2015 | Clifton | H01L 31/0352 372/45.011 |

FOREIGN PATENT DOCUMENTS

JP 2001-320136 11/2001

OTHER PUBLICATIONS

S. Golka et al., "GaAs/AlGaAs Quantum Cascade Lasers With Dry Etched Semiconductor-Air Bragg Reflectors", *Journal of Modern Optics*, vol. 52, No. 16, pp. 2303-2308, Nov. 10, 2005.

* cited by examiner

*Primary Examiner* — Dung Nguyen
(74) *Attorney, Agent, or Firm* — Smith, Gambrell & Russell, LLP.

(57) ABSTRACT

A quantum cascade laser includes a semiconductor region having a main surface including first and second regions arranged in a first axis direction; a stacked semiconductor layer disposed on the second region, the stacked semiconductor layer including a core layer and an upper cladding layer disposed on the core layer; and a distributed Bragg reflector disposed on the first region, the distributed Bragg reflector including at least one semiconductor wall having a side surface extending in a second axis direction perpendicular to the main surface of the semiconductor region, the semiconductor wall including the core layer and the upper cladding layer. The side surface of the semiconductor wall is optically coupled to an end facet of the stacked semiconductor layer. The side surface of the semiconductor wall includes a side surface of the core layer having a recess portion depressed from a side surface of the upper cladding layer in the semiconductor wall.

8 Claims, 6 Drawing Sheets

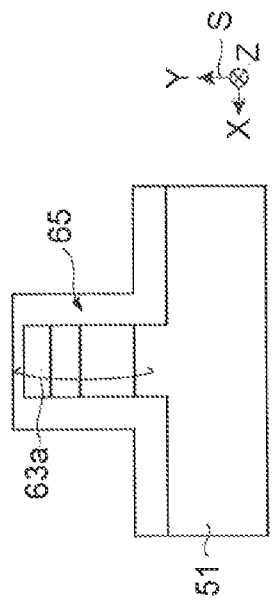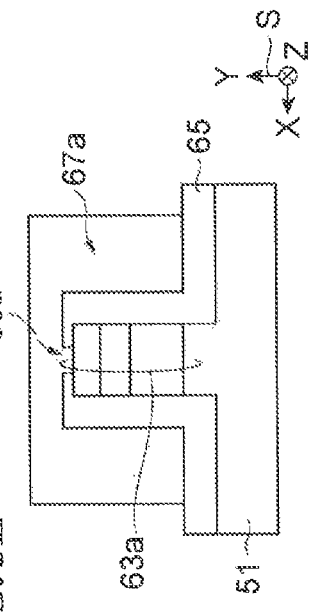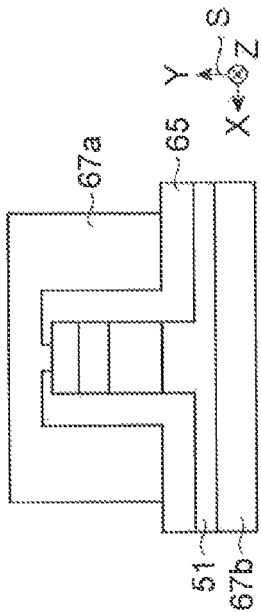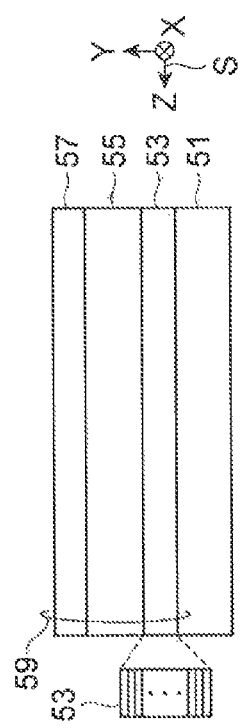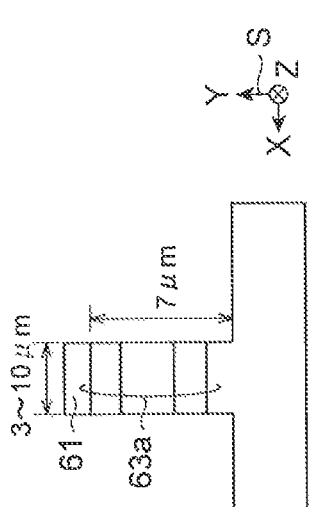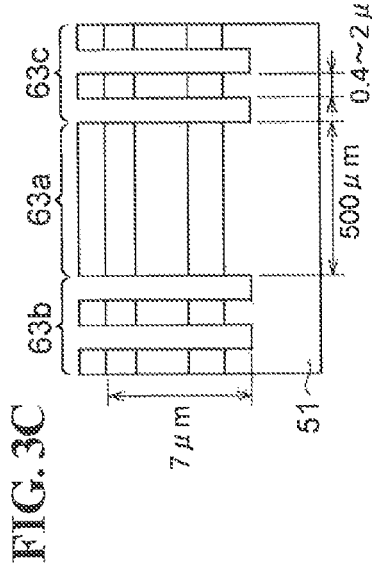

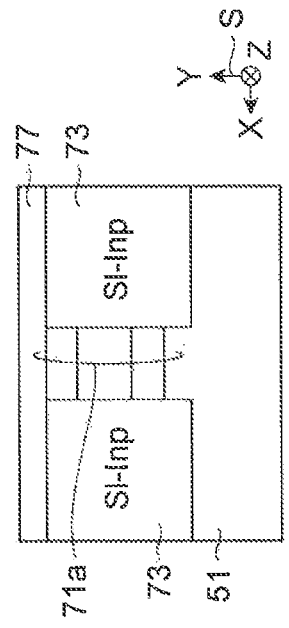
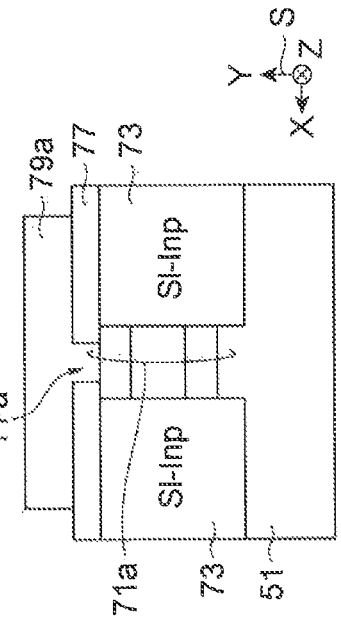
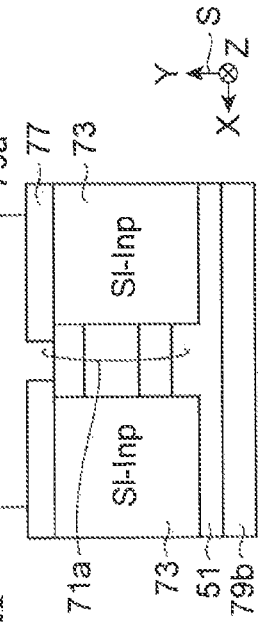
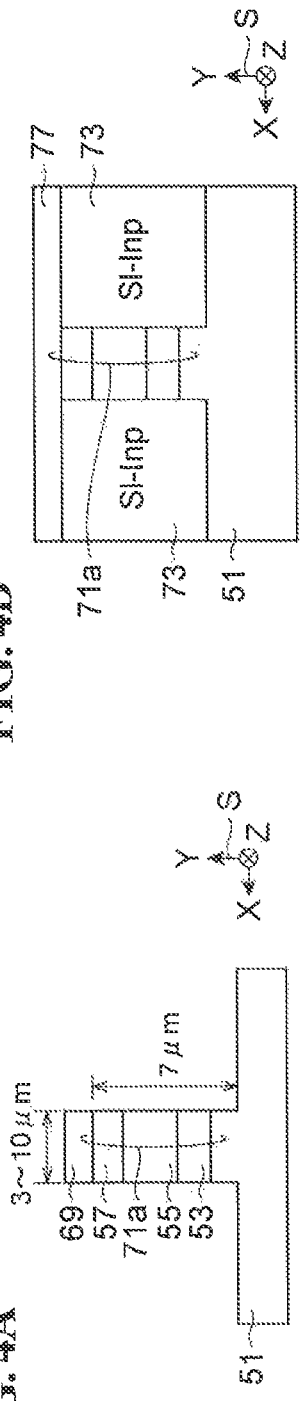
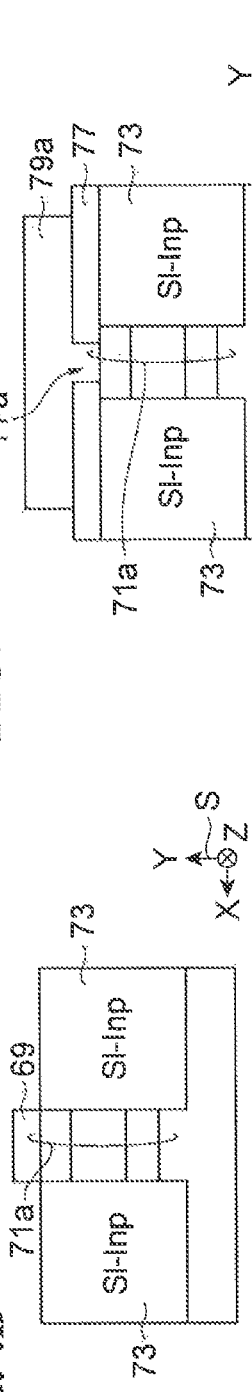
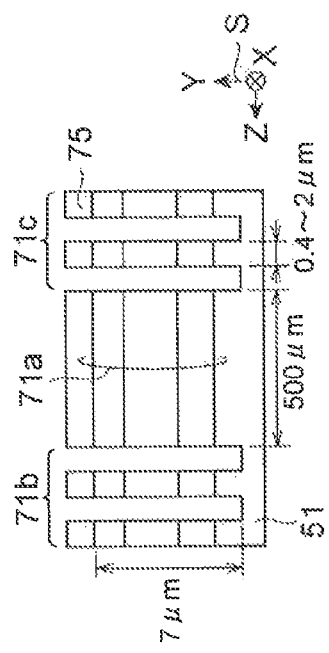

QUANTUM CASCADE LASER

BACKGROUND OF THE INVENTION

1. Field of the Invention

The present invention relates to a quantum cascade laser.

2. Description of the Related Art

Japanese Unexamined Patent Application Publication No. 2001-320136 discloses a quantum cascade laser (QCL). S. Golka, et al., Journal of Modern Optics Vol. 52, No. 16, 10, November 2005, pp. 2303-2308 also discloses a quantum cascade laser (QCL).

Quantum cascade lasers (QCLs) utilize light emission resulting from intersubband electron transition in the conduction band and emit light having a wavelength of a mid-infrared wavelength range of 3 to 10 µm. For example, a distributed Bragg reflector (DBR) structure is used as a reflector (mirror) of a laser cavity of the quantum cascade laser (QCL). The reflector having a large reflectivity may be realized by using the distributed Bragg reflector (DBR) structure. In the quantum cascade lasers (QCLs), a distributed Bragg reflector (hereinafter referred to as DBR) is formed at one side or both sides of the active region of the quantum cascade laser (QCL) that includes a core layer for producing mid-infrared light. The DBR of quantum cascade laser (QCL) includes a diffraction grating having a predetermined period and functions as a reflector (mirror) for the laser cavity.

SUMMARY OF THE INVENTION

For example, in a quantum cascade laser (hereinafter referred to as QCL) that includes a single DBR disposed at one side of the active region of the QCL, a laser cavity is composed of a cleaved facet and the DBR opposite to the cleaved facet. The laser cavity also includes an active region including a core layer between the cleaved facet and the DBR. In a QCL that includes DBRs disposed at both sides of the active region of the QCL, a laser cavity is composed of the two DBRs opposite to each other. The laser cavity also includes an active region including a core layer between the two DBRs. Light emitted from an end facet of the active region of the QCL in a longitudinal direction is optically coupled to the DBR while spreading in the transverse direction perpendicular to the longitudinal direction. Due to the spread of light, amounts of light reflected by the DBR decrease. As a result, the effective reflectivity of the DBR is decreased and the optical loss of the laser cavity is increased.

A quantum cascade laser according to one aspect of the present invention includes a semiconductor region having a main surface including a first region and a second region arranged in a first axis direction; a stacked semiconductor layer disposed on the second region of the semiconductor region, the stacked semiconductor layer including a core layer and an upper cladding layer disposed on the core layer; and a distributed Bragg reflector disposed on the first region of the semiconductor region, the distributed Bragg reflector including at least one semiconductor wall having a side surface extending in a second axis direction perpendicular to the main surface of the semiconductor region, the semiconductor wall including the core layer and the upper cladding layer. The side surface of the semiconductor wall is optically coupled to an end facet of the stacked semiconductor layer. In addition, the side surface of the semiconductor wall includes a side surface of the core layer having a recess portion depressed from a side surface of the upper cladding layer in the semiconductor wall.

The above and further objects, features, and advantages of the present invention will become more apparent from the following detailed description of preferred embodiments of the present invention with reference to the accompanying drawings.

BRIEF DESCRIPTION OF THE DRAWINGS

FIGS. 3A to 3F are main process drawings of a method for producing a quantum cascade laser (double-channel structure) according to an embodiment of the present invention.

FIGS. 4A to 4F are main process drawings of a method for producing a quantum cascade laser (buried structure) according to an embodiment of the present invention.

DESCRIPTION OF THE PREFERRED EMBODIMENTS

Figure 1:
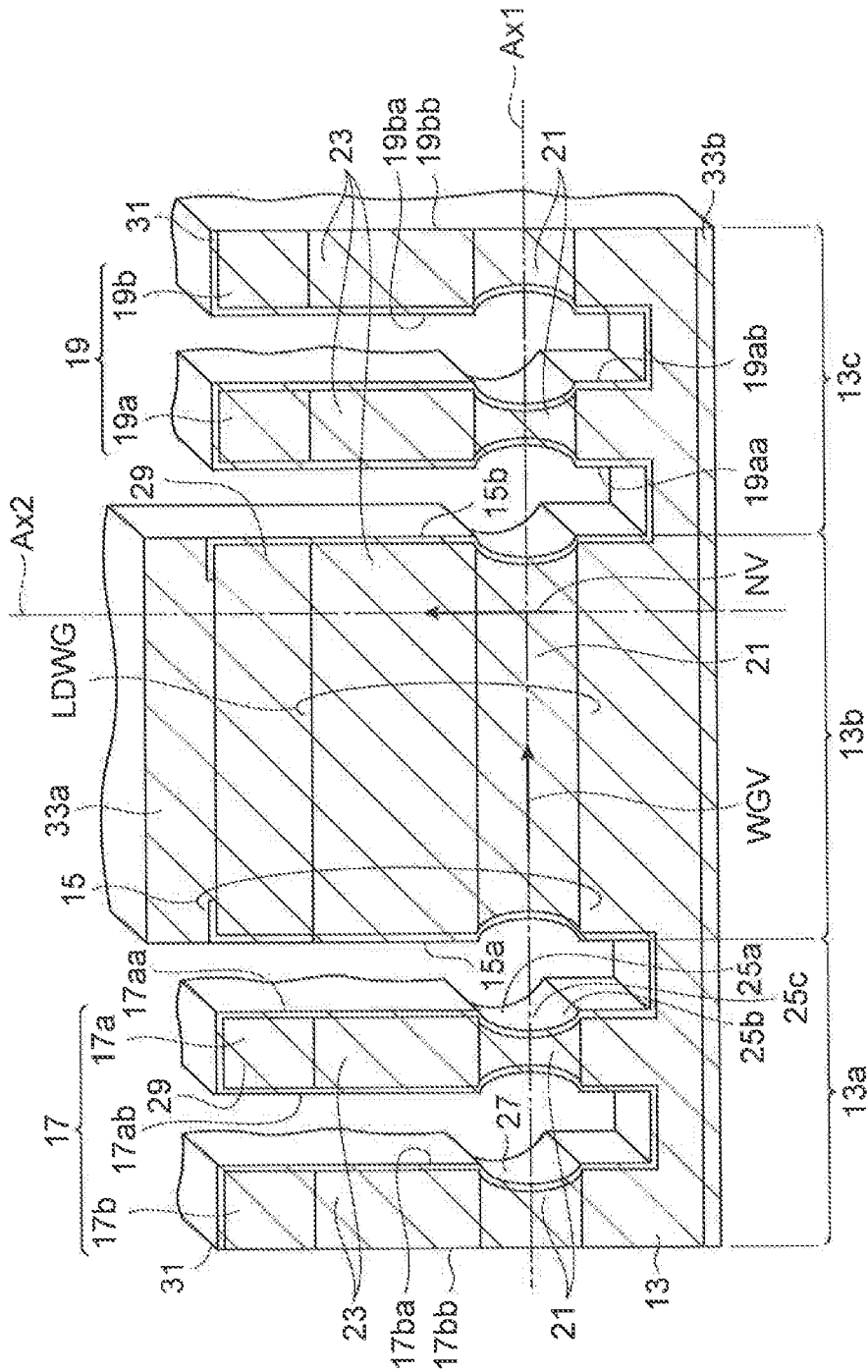
FIG. 1 is a schematic view of a structure of a quantum cascade laser according to an embodiment of the present invention.

Specific embodiments will be described below.

A quantum cascade laser according to an embodiment of the present invention includes (a) a semiconductor region having a main surface including a first region and a second region arranged in a first axis direction; (b) a stacked semiconductor layer disposed on the second region of the semiconductor region, the stacked semiconductor layer including a core layer and an upper cladding layer disposed on the core layer; and (c) a distributed Bragg reflector disposed on the first region of the semiconductor region, the distributed Bragg reflector including at least one semiconductor wall having a side surface extending in a second axis direction perpendicular to the main surface of the semiconductor region, the semiconductor wall including the core layer and the upper cladding layer. The side surface of the semiconductor wall is optically coupled to an end facet of the stacked semiconductor layer. In addition, the side surface of the semiconductor wall includes a side surface of the core layer having a recess portion depressed from a side surface of the upper cladding layer in the semiconductor wall.

In a quantum cascade laser according to an embodiment, preferably, the side surface of the core layer in the semiconductor wall includes a first portion, a second portion, and a third portion that are arranged in the second axis direction, the third portion being disposed between the first and second portions. The first portion of the core layer in the semiconductor wall has an inclined side surface that is inclined inward from the upper cladding layer toward the semiconductor region. The second portion of the core layer in the semiconductor wall has an inclined side surface that is inclined outward from the upper cladding layer toward the semiconductor region. In addition, the third portion of the core layer in the semiconductor wall has a deepest portion of the recess portion.

In a quantum cascade laser according to an embodiment, preferably, the side surface of the core layer in the semiconductor wall includes a first portion, a second portion, and a third portion that are arranged in the second axis direction, the third portion being disposed between the first and second portions. The first portion of the core layer in the semiconductor wall has a side surface having an inverted mesa shape. The second portion of the core layer in the semiconductor wall has a side surface having a normal mesa shape. In addition, the third portion of the core layer in the semiconductor wall includes a deepest portion of the recess portion.

In a quantum cascade laser according to an embodiment, preferably, the recess portion of the core layer in the semiconductor wall has a concave structure configured to converge light reflected by the semiconductor wall toward the end facet of the stacked semiconductor layer.

In the quantum cascade laser, the stacked semiconductor layer and the distributed Bragg reflector are disposed on the second region and the first region of the semiconductor region, respectively. The stacked semiconductor layer includes the core layer and the upper cladding layer disposed on the core layer. The distributed Bragg reflector includes at least one semiconductor wall. The semiconductor wall also includes the core layer and the upper cladding layer. The side surface of the semiconductor wall is optically coupled to the end facet of the stacked semiconductor layer. The side surface of the core layer in the semiconductor wall has a recess portion depressed from a side surface of the upper cladding layer in the semiconductor wall.

In one embodiment, in the recess portion of the core layer in the semiconductor wall, the first portion of the core layer has the inclined side surface inclined inward from the upper cladding layer toward the semiconductor region. On the other hand, the second portion of the core layer has the inclined side surface inclined outward from the upper cladding layer toward the semiconductor region. The third portion of the core layer in the semiconductor wall has a deepest portion of the recess portion.

In another embodiment, the side surface of the first portion and the side surface of the second portion of the core layer have the inverted mesa shape and the normal mesa shape, respectively.

Furthermore, the recess portion of the core layer in the semiconductor wall has the concave structure configured to converge light reflected by the semiconductor wall toward the end facet of the stacked semiconductor layer.

Accordingly, the semiconductor wall having the concave structure in the recess portion of the core layer imparts convergence rather than divergence to light reflected from the side surface of the semiconductor wall toward the end facet of the stacked semiconductor layer. As a result, light reflected from the side surface of the semiconductor wall is effectively returned to the core layer of the stacked semiconductor layer. Therefore, an effective reflectivity of the distributed Bragg reflector is increased.

In a quantum cascade laser according to an embodiment, the core layer may have a thickness of 1.5 μm or more. In the quantum cascade laser, the core layer with the large thickness of 1.5 μm or more increases the amount of reflected light from the distributed Bragg reflector constituting a mirror of a laser cavity.

In a quantum cascade laser according to an embodiment, the core layer may include a multi quantum well structure including an AlInAs layer and an InGaAs layer that are alternately stacked.

A quantum cascade laser according to an embodiment of the present invention may further include a semiconductor mesa extending in the first axis direction, the semiconductor mesa including the stacked semiconductor layer; a first trench and a second trench that define the semiconductor mesa; and a first terrace and a second terrace that are extended in the first axis direction. The first trench is defined by the first terrace and the semiconductor mesa. The second trench is defined by the second terrace and the semiconductor mesa. The semiconductor wall is extended in a direction intersecting with the first axis direction. In addition, the semiconductor wall has one end connected to the first terrace and the other end connected to the second terrace. In the quantum cascade laser, the first terrace and the second terrace support the semiconductor wall having the recess portion on the side surface of the core layer.

A quantum cascade laser according to an embodiment of the present invention may further include a semiconductor mesa extending in the first axis direction, the semiconductor mesa including the stacked semiconductor layer; and a buried region disposed on side surfaces of the semiconductor mesa so as to embed the semiconductor mesa. The semiconductor wall is extended in a direction intersecting with the first axis direction. In addition, the semiconductor wall has one end and the other end opposite to the one end that are connected to the buried region. In the quantum cascade laser, the buried region supports the semiconductor wall having the recess portion on the side surface of the core layer.

The findings of the present invention will be better understood from the following detailed description with reference to the accompanying illustrative drawings. A quantum cascade laser and a method for producing a quantum cascade laser according to an embodiment of the present invention will be described below with reference to the accompanying drawings. Like reference numerals denote like parts throughout the drawings.

FIG. 1 is a schematic view of a structure of a quantum cascade laser (QCL) according to the present embodiment. Referring to FIG. 1, a quantum cascade laser (QCL) 11 includes a semiconductor region 13 having a first conductivity type, a stacked semiconductor layer 15, a first distributed Bragg reflector 17, and a second distributed Bragg reflector 19. The first distributed Bragg reflector 17, the stacked semiconductor layer 15 and the second distributed Bragg reflector 19 are arranged in a longitudinal direction. The stacked semiconductor layer 15 is disposed between the first distributed Bragg reflector 17 and the second distributed Bragg reflector 19. The stacked semiconductor layer 15 includes a first end facet 15a and a second end facet 15b opposite to the first end facet 15a. In the embodiment, the quantum cascade laser 11 includes the two distributed Bragg reflectors. The quantum cascade laser 11 may include a single distributed Bragg reflector. FIG. 1 illustrates a cross section along a reference face defined by a waveguide vector WGV and a normal axis NV of a main surface of the semiconductor region 13. The waveguide vector WGV indicates the longitudinal direction in which a laser waveguide LDWG of the quantum cascade laser 11 is extended. The waveguide vector WGV indicates the direction from the first distributed Bragg reflector 17 to the second distributed Bragg reflector 19. The first distributed Bragg reflector 17 and the second distributed Bragg reflector 19 constitute a laser cavity of the quantum cascade laser 11.

The semiconductor region 13 includes a first region 13a, a second region 13b, and a third region 13c. The first region 13a, the second region 13b, and the third region 13c are arranged along a first axis Ax1 (for example, in the direction of the waveguide vector WGV). The stacked semiconductor layer 15 is disposed on a main surface of the second region 13b. The stacked semiconductor layer 15 includes a core layer 21 and an upper cladding layer 23 having the first conductivity type. The core layer 21 and the upper cladding layer 23 are arranged in order along a second axis Ax2, which crosses the first axis Ax1 (for example, in the direction of the normal axis NV). The core layer 21 constitutes an active region of the quantum cascade laser 11.

The first distributed Bragg reflector 17 is disposed on a main surface of the first region 13a and includes at least one semiconductor wall 17a (17b). The semiconductor wall 17a (17b) has a first side surface 17aa (17ba) and a second side surface 17ab (17bb) along the second axis Ax2. The second side surface 17ab is opposite the first side surface 17aa. The second side surface 17bb is also opposite the first side surface 17ba. The second distributed Bragg reflector 19 is disposed on a main surface of the third region 13c and includes at least one semiconductor wall 19a (19b). The semiconductor wall 19a (19b) has a first side surface 19aa (19ba) and a second side surface 19ab (19bb) along the second axis Ax2. The second side surface 19ab is opposite the first side surface 19aa. The second side surface 19bb is also opposite the first side surface 19ba. The first side surface 17aa of the semiconductor wall 17a faces the first end facet 15a of the stacked semiconductor layer 15, and is optically coupled to the first end facet 15a of the stacked semiconductor layer 15. The first side surface 19aa of the semiconductor wall 19a faces the second end facet 15b of the stacked semiconductor layer 15, and is optically coupled to the second end facet 15b of the stacked semiconductor layer 15.

The semiconductor walls 17a, 17b, 19a, and 19b include the core layer 21 and the upper cladding layer 23. The core layer 21 in the semiconductor wall 17a (17b, 19a, 19b) includes a first portion 25a, a second portion 25b, and a third portion 25c. The first portion 25a, the third portion 25c, and the second portion 25b are arranged in order along the second axis Ax2. That is, the third portion 25c is disposed between the first portion 25a and the second portion 25b. A side surface of the core layer 21 in the semiconductor wall 17a (17b, 19a, 19b) has a recess portion 27 depressed from a side surface of the upper cladding layer 23 in the semiconductor wall 17a (17b, 19a, 19b). The first portion 25a of the core layer 21 in the semiconductor wall 17a (17b, 19a, 19b) has an inclined side surface that is inclined inward from the upper cladding layer 23 toward the semiconductor region 13. The first portion 25a has an inverted mesa shape when viewed from a direction perpendicular to the first axis Ax1 and the second axis Ax2 as described in FIG. 1. The second portion 25b has an inclined side surface that is inclined outward from the upper cladding layer 23 toward the semiconductor region 13. The second portion 25b has a normal mesa shape when viewed from the direction perpendicular to the first axis Ax1 and the second axis Ax2. The third portion 25c has the deepest portion of the recess portion 27.

In the quantum cascade laser 11, the first portion 25a and the second portion 25b of the core layer 21 have the inclined side surfaces that are inclined opposite to each other from the upper cladding layer 23 toward the semiconductor region 13. In addition, the inclined side surfaces of the first portion 25a and the second portion 25b constitute a part of the first side surface 17aa (19aa) optically coupled to the first end facet 15a (the second end facet 15b) of the stacked semiconductor layer 15. Thus, the core layer 21 in the semiconductor wall 17a (19a) has the inclined side surfaces to form a concave shape. The concave structure having the inclined side surfaces that are inclined opposite to each other impart convergence rather than divergence to reflection of light on the first side surface 17aa (19aa) of the semiconductor wall 17a (19a). Therefore, light beam reflected by the semiconductor wall 17a (17b, 19a, 19b) is converged toward the first end facet 15a (the second end facet 15b) of the stacked semiconductor layer 15 due to the concave structure in the core layer of the semiconductor wall 17a (17b, 19a, 19b). The concave structure improves the effective reflectivity of the distributed Bragg reflectors (17, 19).

The core layer 21 preferably has a thickness of 1.5 µm or more, for example. The core layer 21 of the quantum cascade laser 11 has a greater thickness than active layers of conventional laser diodes emitting a light having a wavelength of 1.3 µm to 155 µm for use in optical fiber communication systems. The thicker core layer of the semiconductor wall 17a (17b, 19a, 19b) in the distributed Bragg reflectors (17, 19) increases the amount of reflected light from the distributed Bragg reflectors (17, 19). In addition, the thicker core layer of the stacked semiconductor layer 15 increases the amount of received light through the first end facet 15a (the second end facet 15b) of the stacked semiconductor layer 15. The core layer 21 preferably has a thickness of 3 µm or less, for example. When the core layer 21 has a thickness of more than 3 µm, an injection current and light are insufficiently confined in the core layer 21. This increases a threshold current and a driving current for the quantum cascade laser.

The core layer 21 has a super lattice structure (or a multi quantum well (MQW) structure) that includes different semiconductor layers stacked alternately. In the present embodiment, the super lattice structure includes AlInAs layers and InGaAs layers that are stacked alternately. In the quantum cascade laser 11, the recess portion 27 having a normal mesa structure and an inverted mesa structure is formed by wet etching and/or dry etching on a side surface of the core layer 21 in the semiconductor wall 17a (19a).

The semiconductor region 13 is preferably include a substrate. The substrate serves as a support having a large mechanical strength. The substrate is made of a III-V group compound semiconductor such as InP. The stacked semiconductor layer 15 is grown on the substrate of the semiconductor region 13 by using an epitaxial growth method.

The stacked semiconductor layer 15 and the semiconductor wall 17a (17b, 19a, 19b) further include a contact layer 29 disposed on the upper cladding layer 23. The top surfaces and the side surfaces of the stacked semiconductor layer 15 and the semiconductor wall 17a (17b, 19a, 19b) are covered with a passivation film 31. The passivation film 31 has an opening on the top surface of the stacked semiconductor layer 15. An electrode 33a is formed in the opening of the passivation film 31 in contact with the top surface of the stacked semiconductor layer IS. An electrode 33b is disposed on a back surface of the semiconductor region 13 (on a back surface of the substrate). In one embodiment, the electrode 33a and the electrode 33b correspond to an anode electrode and a cathode electrode, respectively.

Figure 2A:
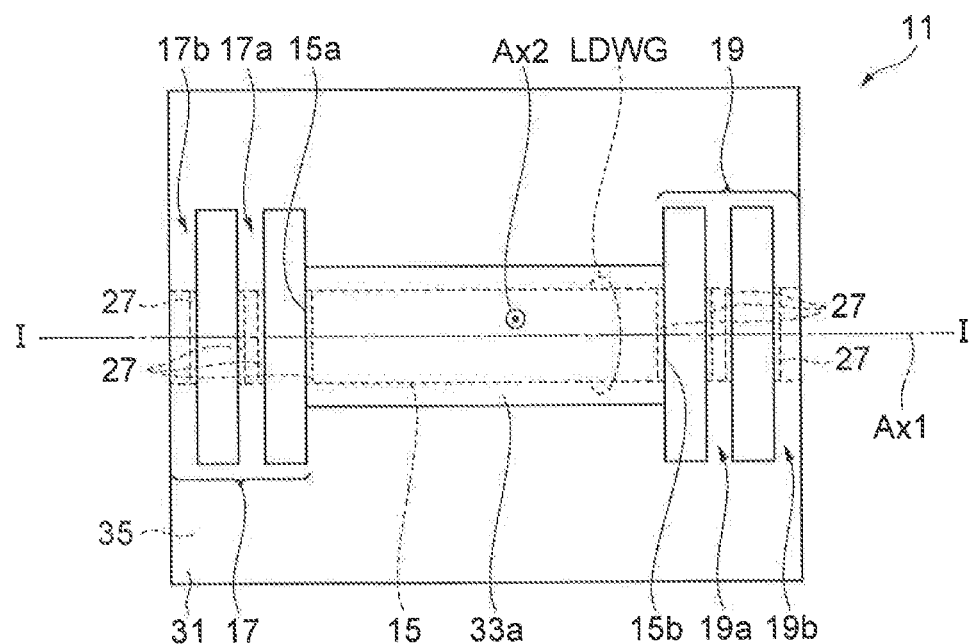
FIGS. 2A and 2B are schematic views of a buried structure and a double-channel structure for a quantum cascade laser according to an embodiment of the present invention.
Figure 2B:
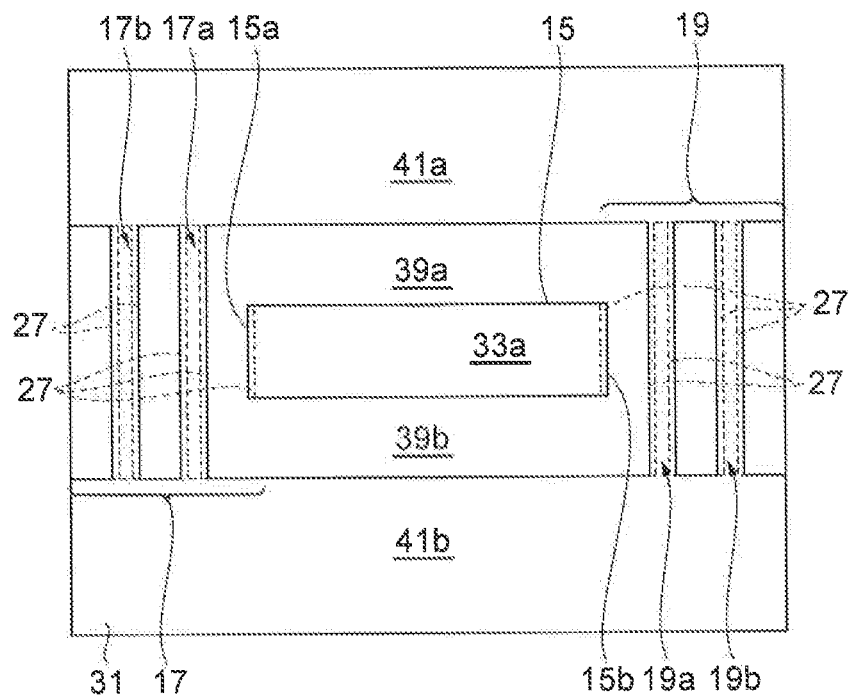

FIGS. 2A and 2B are plan views of a structure of a distributed Bragg reflector of a quantum cascade laser according to the present embodiment. The quantum cascade laser 11 illustrated in FIG. 1 has a buried region 35 illustrated in FIG. 2A. In this buried structure, a stripe-shaped semiconductor mesa extending along the first axis Ax1 is embedded with the buried region 35. The stripe-shaped semiconductor mesa includes the core layer 21 and the upper cladding layer 23 in the stacked semiconductor layer 15. The stripe-shaped semiconductor mesa is disposed on the substrate. The buried region 35 is composed of a semi-insulating semiconductor (for example, Fe-doped InP) or a resin (for example, benzocyclobutene (BCB) resin). The cross section of FIG. 1 is taken along a reference face defined by a waveguide vector, which indicates the direction of a laser waveguide of the quantum cascade laser 11, and by a normal axis of the substrate and corresponds to a cross section taken along the line I-I in FIG. 2A.

The semiconductor wall 17a (17b, 19a, 19b) is extended in a direction intersecting with the first axis Ax1, and has one end and the other end opposite to the one end that are connected to the buried region 35. In the quantum cascade laser 11, the buried region 35 supports the semiconductor wall 17a (17b, 19a, 19b) having the recess portion 27 on the side surface of the core layer 21. In the semiconductor wall 17a (17b, 19a, 19b), the recess portion 27 on the side surface of the core layer 21 is terminated at a boundary between the core layer 21 and the buried region 35.

The quantum cascade laser 11 illustrated in FIG. 1 may have a double-channel structure 37 illustrated in FIG. 2B. In the double-channel structure 37, the quantum cascade laser 11 further includes a first trench 39a and a second trench 39b, which define the stacked semiconductor layer 15. The first trench 39a is defined by a first terrace 41a and the stacked semiconductor layer 15. The first terrace 41a also extends along the first axis Ax1. The second trench 39b is defined by a second terrace 41b and the stacked semiconductor layer 15. The second terrace 41b also extends along the first axis Ax1. The stacked semiconductor layer 15 and the first terrace 41a are separated from each other by an air gap in the first trench 39a. Similarly, the stacked semiconductor layer 15 and the second terrace 41b are separated from each other by an air gap in the second trench 39b. The stacked semiconductor layer 15 has a ridge structure defined by the first trench 39a and the second trench 39b. Specifically, in the ridge structure, a ridge-shaped semiconductor mesa defined by the first trench 39a and the second trench 39b is disposed on the substrate. The ridge-shaped semiconductor mesa includes the core layer 21 and the upper cladding layer 23 in the stacked semiconductor layer 15.

The semiconductor wall 17a (17b, 19a, 19b) is extended in a direction intersecting with the first axis Ax1, and has one end connected to the first terrace 41a and the other end connected to the second terrace 41b. In the quantum cascade laser 11, the first terrace 41a and the second terrace 41b support the semiconductor wall 17a (17b, 19a, 19b) having the recess portion 27 on the side surface of the core layer 21.

First Embodiment

A method for producing a quantum cascade laser (QCL) according to an embodiment of the present invention will be described below with reference to FIGS. 3A to 3F. This quantum cascade laser (QCL) includes a distributed Bragg reflector and a double-channel structure. In FIGS. 3A to 3F, the position of a substrate product is indicated by a rectangular coordinate system S. FIGS. 3A to 3F illustrate a substrate product of one device compartment size in each manufacturing step. A plurality of quantum cascade lasers (QCLs) is two-dimensionally arranged on a semiconductor substrate. First, an n-type InP substrate 51 doped with tin (Sn) is prepared. The InP substrate 51 has a main surface of a (100) plane.

As illustrated in FIG. 3A, a core layer 53 is grown on the main surface of the InP substrate 51 in an epitaxial growth step. The core layer 53 is grown by a metal-organic vapor phase epitaxy (MOVPE) method or a molecular beam epitaxial growth (MBE) method, for example. The core layer 53 includes a light-emitting portion and an injection portion, which have a super lattice structure (or a multi quantum well (MQW) structure). The super lattice structure includes InGaAs layers and AlInAs layers that are alternately stacked. The InGaAs layer has a thickness in the range of 0.5 to 10 nm. The AlInAs layer has a thickness in the range of 0.5 to 10 nm. The thickness of each layer is controlled to emit light having a predetermined oscillation wavelength of 3 to 10 μm from the core layer 53. The number of pairs of the InGaAs layers and the AlInAs layers is selected in the range of 20 to 60. In the present embodiment, the super lattice structure includes 30 pairs of the InGaAs layers and the AlInAs layers. The super lattice structure has a thickness of, for example, 2.3 μm. A conventional semiconductor laser emitting light having a wavelength of 1.3 to 1.55 μm has a typical thickness of 0.2 μm. Therefore, the super lattice structure of the quantum cascade laser has a larger thickness as compared with the conventional semiconductor laser. An n-type InP cladding layer 55 is successively grown on the core layer 53. The n-type InP cladding layer 55 has a thickness of 3 μm. An n-type InGaAs contact layer 57 is also grown on the n-type InP cladding layer 55, successively. The n-type InGaAs contact layer 57 has a thickness of 100 nm. The n-type InP cladding layer 55 and the n-type InGaAs contact layer 57 are doped with silicon (Si) as an n-type impurity. Thus, the core layer 53, the n-type InP cladding layer 55, and the n-type InGaAs contact layer 57 are epitaxially grown on the InP substrate 51 successively to form a stacked semiconductor layer 59.

As illustrated in FIGS. 3B and 3C, a ridge-shaped semiconductor mesa is then formed in an etching step. A mask 61 is formed on a surface of the stacked semiconductor layer 59 grown in the prior step. The mask 61 has a first pattern for forming the ridge-shaped semiconductor mesa and second patterns for forming a plurality of semiconductor walls that constitute a distributed Bragg reflector. The first pattern extends in a first direction of a <0-1-1> direction of the InP substrate 51. The second patterns extend in a second direction of a <0-11> direction that is perpendicular to the first direction and are periodically arranged at a predetermined pitch in the first direction. In the embodiment, the first and second directions correspond to directions along the z axis and the x axis of the rectangular coordinate system S, respectively. The mask 61 is composed of a silicon based inorganic compound film, such as a silicon nitride (SiN) film, a silicon dioxide (SiO$_2$) film, or a silicon oxy-nitride (SiON) film. Such a dielectric film is formed by a chemical vapor deposition (CVD) method. In the present embodiment, the mask 61 is formed of a silicon nitride (SiN) film. The mask 61 has a thickness of 500 nm, for example. The mask 61 is formed by using photolithography and etching techniques. The stacked semiconductor layer 59 is etched by a dry etching method through the mask 61 to form a ridge-shaped semiconductor mesa 63a and distributed Bragg reflectors 63b and 63c. The dry etching is performed by an inductive coupled plasma reactive ion etching (ICP-RIE) method using a halogen gas as an etching gas. In this etching, the stacked semiconductor layer 59 is etched until the InP substrate 51 is exposed. In the embodiment, the InP substrate 51 is further etched by about 1.0 μm from the surface of the InP substrate 51. The ridge-shaped semiconductor mesa 63a is defined by trenches on both sides thereof and has a double-channel structure. On a side surface of a semiconductor wall constituting the distributed Bragg reflectors, the core layer 53 including the super lattice structure is depressed inward from a reference face extending along the side surfaces of the n-type InP cladding layer 55 and the InP substrate 51. The core layer 53 has a concave surface on a side surface of a semiconductor wall. The concave surface is extended in the second direction in which the semiconductor layers constituting the super lattice structure are extended at the side surface of the semiconductor wall. In the recess portion, the side surface of the core layer 53 is gradually deepened relative to a side surface of the n-type InP cladding layer 55 (the upper cladding region) from an edge of the n-type InP cladding layer 55 in the direction from the n-type InP cladding layer 55 to the InP substrate 51, and then gradually becomes shallow relative to a side surface of the InP substrate 51 (the lower cladding region) toward an edge of the InP substrate 51.

One example of the etching conditions in the present embodiment:

Halogen gas: HI gas.
Plasma excitation gas: Ar gas.
(Flow ratio) Mixing ratio of these gases: [HI]:[Ar]=2:8 to 10:0. Alternatively, HI gas 100%.
[HI]/([HI]+[Ar])=0.2 to 1.

In the above etching conditions, the etch rate of the AlGaAs layers and the InGaAs layers of the super lattice structure of the core layer 53 is higher than the etch rate of InP in the upper and lower cladding regions disposed on the top and bottom of the core layer. In this case, the super lattice structure in the core layer is isotropically etched as compared with the cladding regions. On the other hand, the cladding regions are etched anisotropically so as to have a side surface substantially perpendicular to the main surface of the InP substrate 51. Because of the difference in etch rate between the super lattice structure of the core layer and the cladding regions and the difference in etching anisotropy, a side surface of the super lattice structure has inclined side surfaces that are inclined inward and outward from the n-type InP cladding layer 55 toward the InP substrate 51. Specifically, the side surface of the super lattice structure has a normal mesa shape relative to a side surface of one (the lower cladding region) of the cladding regions and has an inverted mesa shape relative to a side surface of the other cladding region (the upper cladding region) when viewed from the second direction in which the concave side surface of the core layer 53 is extended.

The stacked semiconductor layer may be etched under the dry etching conditions that result in a small difference in etch rate between the cladding regions (the upper and lower cladding regions) and the super lattice structure of the core layer 53, thereby forming a semiconductor wall having a flatter side surface than the side surface of the semiconductor wall having a recess portion at the core layer 53 described above. In order to form a recess portion on a side surface of the core layer 53 in the semiconductor wall, the super lattice structure in the semiconductor wall may be selectively etched by using wet-etching method, after the semiconductor wall is formed by dry-etching the stacked semiconductor layer 59. As a result of selectively etching the super lattice structure, a concave surface is formed on the side surface of the core layer 53 in the semiconductor wall. In this wet etching, an etchant of a liquid mixture of hydrochloric acid/acetic acid/hydrogen peroxide is used, for example. By using the selective wet-etching method in which an etching rate of etching the AlGaAs layer and the InGaAs layer constituting the super lattice structure is larger than an etching rate of etching the InP layer constituting the upper and lower cladding layers, the concave structure having the concave surface on the side surface of the core layer 53 in the semiconductor wall is also formed.

After the ridge-shaped semiconductor mesa 63a and the distributed Bragg reflectors 63b and 63c are formed by dry etching, the SiN mask 61 is removed with a hydrofluoric acid solution. As illustrated in FIG. 3D, a passivation film 65 is then formed on the entire surface of the substrate in a passivation film forming step. The passivation film 65 is formed of a silicon-based inorganic insulating film, such as a silicon dioxide ($SiO_2$) film, a silicon nitride (SiN) film, or a silicon oxy-nitride (SiON) film, and is formed by using a plasma chemical vapor deposition (CVD) method, for example. The passivation film 65 has a thickness of 300 nm, for example.

As illustrated in FIG. 3E, an opening 65a is formed in the passivation film 65 on the ridge-shaped semiconductor mesa 63a in an upper electrode forming step. The opening 65a is formed by wet etching through a resist mask. A hydrofluoric acid solution is used as an etchant in the wet etching. After the opening 65a is formed, an upper electrode 67a is formed in the opening 65a of the passivation film 65 by using an evaporation method. The upper electrode 67a is formed of, for example, a Ti/Pt/Au multilayer structure. The upper electrode 67a is patterned by photolithography and a lift-off method. The upper electrode 67a has a thickness of 500 nm, for example.

As illustrated in FIG. 3F, the back surface of the InP substrate is polished to form a polished surface. The InP substrate after polishing has a thickness of 100 μm, for example. A lower electrode 67b is formed on the back surface (for example, the InP polished surface) of the InP substrate by using an evaporation method in a lower electrode forming step. The lower electrode 67b is made of, for example, a AuGeNi/Au multilayer structure. The lower electrode 67b has a thickness of 1 μm. A substrate product is formed through these steps. The substrate product is cleaved to form a laser bar. The laser bar is divided into a plurality of semiconductor laser chips to form a quantum cascade laser (QCL). Thus, a distributed Bragg reflector (DBR)-type quantum cascade laser (QCL) is produced through these steps.

The distance from the end facet of the ridge-shaped semiconductor mesa 63a to the side surface of the semiconductor wall of the distributed Bragg reflector (63b or 63c) faced the semiconductor mesa 63a in the longitudinal direction (first direction) is one-fourth (λ/4) of the oscillation wavelength (λ) of the quantum cascade laser. Similarly, the semiconductor walls of the distributed Bragg reflector having a length of one-fourth (λ/4) of the oscillation wavelength (λ) are periodically arranged in the longitudinal direction (first direction) with an interval (gap) of one-fourth (λ/4) of the oscillation wavelength (λ) to form a λ/4 DBR. The distance between the ridge-shaped semiconductor mesa 63a and the semiconductor wall faced the semiconductor mesa 63a, the length of the semiconductor walls, and the interval (gap) between the semiconductor walls in the longitudinal direction (first direction) may be set to three-fourth (3λ/4) of the oscillation wavelength (λ) to form a 3λ/4 DBR.

Second Embodiment

A method for producing a quantum cascade laser (QCL) according to an embodiment of the present invention will be described below with reference to FIGS. 4A to 4F. This quantum cascade laser (QCL) includes a distributed Bragg reflector and a buried-heterostructure (BH). The stacked semiconductor layer 59 including the core layer 53, the n-type InP cladding layer 55 doped with Si, and the n-type InGaAs contact layer 57 doped with Si is formed on the main surface of the InP substrate 51 by using an epitaxial growth method such as a MOVPE method and a MBE method in the same manner as in the first embodiment. The main surface of the InP substrate 51 includes a (100) plane. The core layer includes a super lattice structure (or a multi quantum well (MQW) structure) composed of InGaAs layers and AlInAs layers that are stacked alternately as illustrated in FIG. 3A.

The n-type InP cladding layer 55 has a thickness of 3 μm, for example. The n-type InGaAs contact layer 57 has a thickness of 0.5 μm, for example.

In the present embodiment, as illustrated in FIG. 4A, a stripe-shaped semiconductor mesa is then formed. A mask 69 is formed on a surface of the stacked semiconductor layer 59. The mask 69 has a stripe-shaped pattern for forming a semiconductor mesa. This stripe-shaped pattern extends in the first direction of the <0-1-1> direction of the substrate. The mask 69 is formed of, for example, a silicon nitride (SiN) film and is formed by a chemical vapor deposition (CVD) method. The silicon nitride (SiN) film has a thickness of 500 nm. The stripe-shaped pattern of the mask 69 is formed by using photolithography and etching techniques.

The stacked semiconductor layer 59 is etched by a dry etching method through the mask 69 until reaching a middle of the InP substrate 51 to form a stripe-shaped semiconductor mesa 71a. The dry etching is performed by an inductive coupled plasma reactive ion etching (ICP-RIE) method using a halogen gas as an etching gas.

One example of the etching conditions in the present embodiment:
Halogen gas: HI gas.
Plasma excitation gas: Ar gas.
(Flow ratio) Mixing ratio of these gases: [HI]:[Ar]=1:9 to 2:8.
[HI]/([HI]+[Ar])=0.1 to 0.2.

The semiconductor mesa 71a formed under these etching conditions has substantially no recess portion on side surfaces of the core layer thereof. As illustrated in FIG. 4B, after the semiconductor mesa 71a is formed, a semi-insulating InP is grown on the side surfaces of the semiconductor mesa 71a and on the substrate 51 using the SiN mask 69 while leaving the mask 69 on the top surface of the semiconductor mesa 71a. The semi-insulating InP is made of, for example, Fe-doped InP. The semi-insulating InP is grown by using a metal-organic vapor phase epitaxy (MOVPE) method. As a result, both sides of the semiconductor mesa 71a are embedded with a buried region 73. The semiconductor mesa 71a is extended in the first direction of the <0-1-1> direction of the substrate along the z axis of the rectangular coordinate system S. The semiconductor mesa 71a includes the core layer 53, the n-type InP cladding layer 55, and the n-type InGaAs contact layer 57.

As illustrated in FIG. 4C, distributed Bragg reflectors 71b and 71c are formed. A mask 75 is formed on the buried region 73 and the semiconductor mesa 71a. The mask 75 has a pattern for forming the distributed Bragg reflectors 71b and 71c. The mask 75 has a plurality of stripe-shaped openings extending in a second direction perpendicular to the first direction. The second direction corresponds to the <0-11> direction of the substrate along the x axis of the rectangular coordinate system S. The mask 75 is formed of a silicon nitride (SiN) film, for example. The mask 75 is formed by using a chemical vapor deposition (CVD) method. The silicon nitride (SiN) film has a thickness of 500 nm. The pattern of the mask 75 is formed by using photolithography and etching techniques.

The buried region 73 and the semiconductor mesa 71a are etched through the mask 75. The stripe-shaped openings of the mask 75 extend across the semiconductor mesa 71a from the buried region 73 on one side of the semiconductor mesa 71a to the buried region 73 on the other side of the semiconductor mesa 71a.

The buried region 73 and the semiconductor mesa 71a are etched through the mask 75 by using a dry etching method until the InP substrate 51 is exposed. In the embodiment, the InP substrate 51 is further etched by about 1.0 μm from the surface of the InP substrate 51. Thus, the distributed Bragg reflectors 71b and 71c having a semiconductor wall, which is optically coupled to the stripe-shaped semiconductor mesa 71a, are formed. The dry etching is performed by an inductive coupled plasma reactive ion etching (ICP-RIE) method using a halogen gas. On a side surface of the semiconductor wall of the distributed Bragg reflectors 71b and 71c, the core layer 53 including the super lattice structure is depressed inward from a reference face extending along the side surfaces of the cladding regions of the n-type InP cladding layer 55 and the InP substrate 51 that are disposed on the top and bottom of the core layer 53. The core layer 53 has a concave surface on the side surface of the semiconductor wall. The concave surface is extended in the second direction in which the semiconductor layers constituting the super lattice structure are extended at the side surface of the semiconductor wall.

One example of the etching conditions in the present embodiment:
Halogen gas: HI gas.
Plasma excitation gas: Ar gas.
(Flow ratio) Mixing ratio of these gases: [HI]:[Ar]=2:8 to 10:0. Alternatively, HI gas 100%.
[HI]/([HI]+[Ar])=0.2 to 1.

As described in the first embodiment, by using the above etching conditions, the side surface of the super lattice structure of the core layer 53 has a normal mesa shape relative to a side surface of one (the lower cladding region) of the cladding regions and has an inverted mesa shape relative to a side surface of the other cladding region (the upper cladding region) when viewed from the second direction in which the concave side surface of the core layer 53 is extended. Alternatively, as in the first embodiment, semiconductor walls may also be subjected to wet etching.

After the distributed Bragg reflectors are formed by using the dry etching method, the silicon nitride (SiN) film of the mask 75 is removed with a hydrofluoric acid solution. As illustrated in FIG. 4D, a passivation film 77 is then formed on the entire surface of the substrate by using a plasma chemical vapor deposition (CVD) method. The passivation film 77 is formed of a silicon-based inorganic insulating film, such as a silicon dioxide ($SiO_2$) film, a silicon nitride (SiN) film, or a silicon oxy-nitride (SiON) film. The passivation film 77 has a thickness of 300 nm, for example.

As illustrated in FIG. 4E, an opening 77a is formed in the silicon-based inorganic insulating film (the passivation film 77) on the semiconductor mesa 71a and on the distributed Bragg reflectors 71b and 71c. The opening 77a is formed by wet etching through a resist mask. A hydrofluoric acid solution is used as an etchant in the wet etching. After the opening 77a is formed, an electrode 79a is formed in the opening 77a by using an evaporation method. The electrode 79a is made of, for example, a Ti/Pt/Au multilayer structure. The electrode 79a is patterned by photolithography and a lift-off method. The electrode 79a has a thickness of 500 nm, for example.

The back surface of the InP substrate 51 is then polished in the same manner as in the first embodiment, thus forming a polished surface. The InP substrate 51 after polishing has a thickness of 100 μm, for example. A lower electrode 79b is formed on the back surface (the InP polished surface) of the InP substrate 51 by using an evaporation method. The lower electrode 79b is made of, for example, a AuGeNi/Au multilayer structure. The lower electrode 79b has a thickness of 1 μm, for example. A substrate product is formed through these steps. The substrate product is then cleaved to form a laser bar. The laser bar is divided into a plurality of semiconductor laser chips to form a quantum cascade laser (QCL). Thus, a distributed Bragg reflector (DBR)-type quantum cascade laser (QCL) is produced through these steps.

The distance from the end facet of the semiconductor mesa 71a to the side surface of the semiconductor wall of the distributed Bragg reflector (71b or 71c) faced the semiconductor mesa 71a in the longitudinal direction (first direction) is one-fourth ($\lambda/4$) of the oscillation wavelength ($\lambda$) of the quantum cascade laser. Similarly, the semiconductor walls of the distributed Bragg reflector having a length of one-fourth ($\lambda/4$) of the oscillation wavelength ($\lambda$) are periodically arranged in the longitudinal direction (first direction) with an interval (gap) of one-fourth ($\lambda/4$) of the oscillation wavelength ($\lambda$) to form a $\lambda/4$ DBR. The distance between the semiconductor mesa 71a and the semiconductor wall faced the semiconductor mesa 71a, the length of the semiconductor walls, and the interval (gap) between the semiconductor walls in the longitudinal direction (first direction) may be set to three-fourth ($3\lambda/4$) of the oscillation wavelength ($\lambda$) to form a $3\lambda/4$ DBR.

Figure 5:
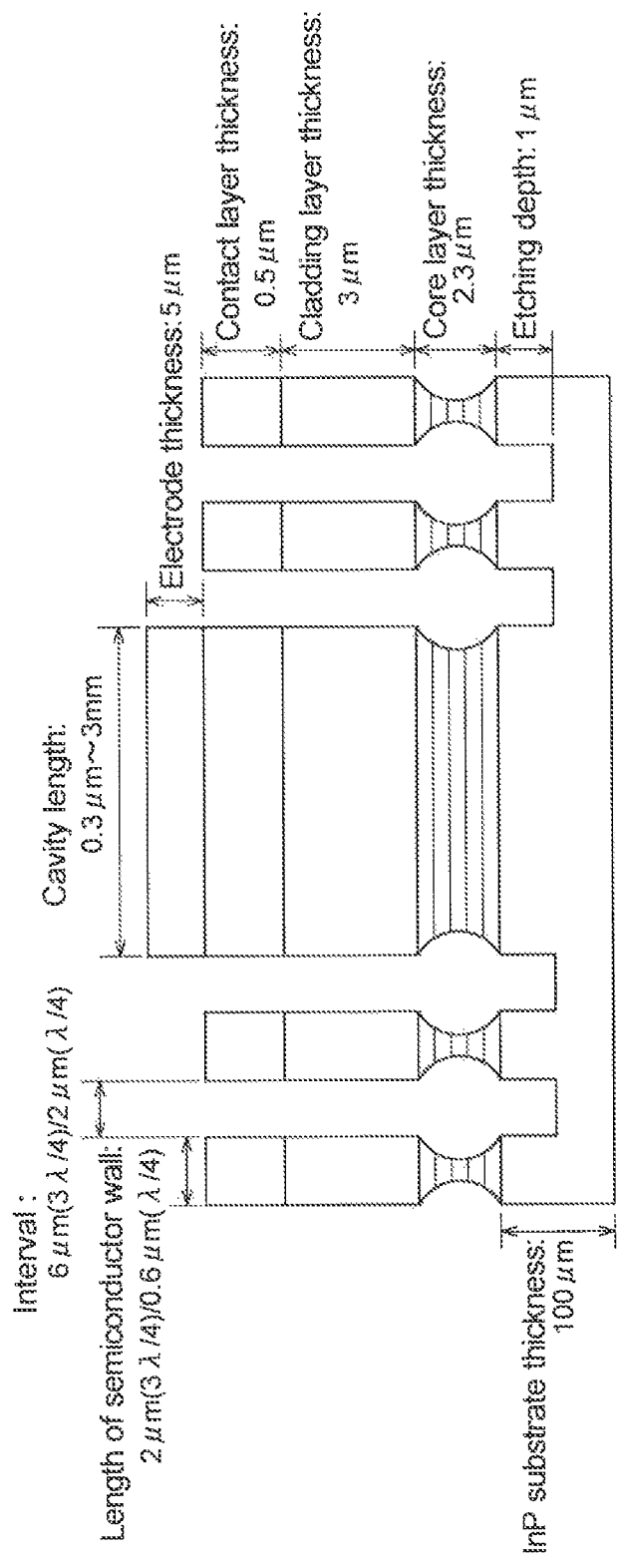
FIG. 5 is a schematic view illustrating the dimensions of a quantum cascade laser according to an embodiment of the present invention.

FIG. 5 is a schematic view illustrating the dimensions of the quantum cascade laser according to the embodiments of the present invention.

Examples of a quantum cascade laser emitting light having a 7 µm wavelength band:

Length of a stripe-shaped mesa (cavity length) in a longitudinal direction (first direction): 0.3 µm to 3 mm.

Thickness of an InP substrate: 100 µm.

Thickness of a core layer including an InGaAs/AlInAs super lattice structure: 2.3 µm.

Width of the stripe-shaped mesa in a direction perpendicular to the longitudinal direction: 3 to 10 µm.

Thickness of an InP cladding layer: 3 µm.

Thickness of an InGaAs contact layer: 0.5 µm.

Thickness of an upper electrode: 5 µm.

Length of a semiconductor wall of a distributed Bragg reflector (DBR) in the longitudinal direction: 2 µm for a $3\lambda/4$ DBR or 0.6 µm for a $\lambda/4$ DBR.

Interval (gap) between the semiconductor walls of the DBR in the longitudinal direction: 6 µm for the $3\lambda/4$ DBR or 2 µm for the $\lambda/4$ DBR.

Etching depth of the InP substrate at a groove between the semiconductor walls measured from the bottom of the core layer to the top surface of the InP substrate: 1 µm.

Figure 6A:
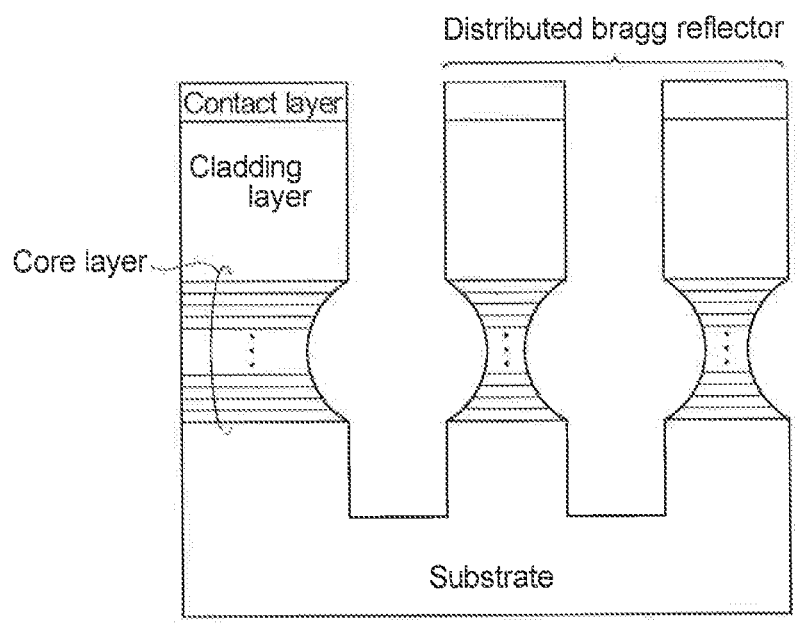
FIG. 6A is a cross-sectional view of a quantum cascade laser according to an embodiment of the present invention.

The reflectivity of a distributed Bragg reflector produced as described in the embodiments is measured. The semiconductor walls of the distributed Bragg reflector formed on a (100) plane of an InP substrate has a structure illustrated in FIG. 6A. Each of the side surfaces of the semiconductor walls has a recess portion described in the embodiments.

Distributed Bragg reflector: 2 periods of $3\lambda/4$ DBR structure (oscillation wavelength: $\lambda$).

Core layer (total thickness: 2.3 µm, thickness of InGaAs layer: 0.5 to 10 nm, thickness of AlInAs layer: 0.5 to 10 nm. The thickness of each layer is selected according to the oscillation wavelength. The number of pairs of the InGaAs layers and the AlInAs layers is in the range of 20 to 60).

n-type InP cladding layer (thickness: 3 µm).

n-type InGaAs contact layer (thickness: 0.5 µm).

Reflectivity of DBRs having a recess portion: 60%.

Figure 6B:
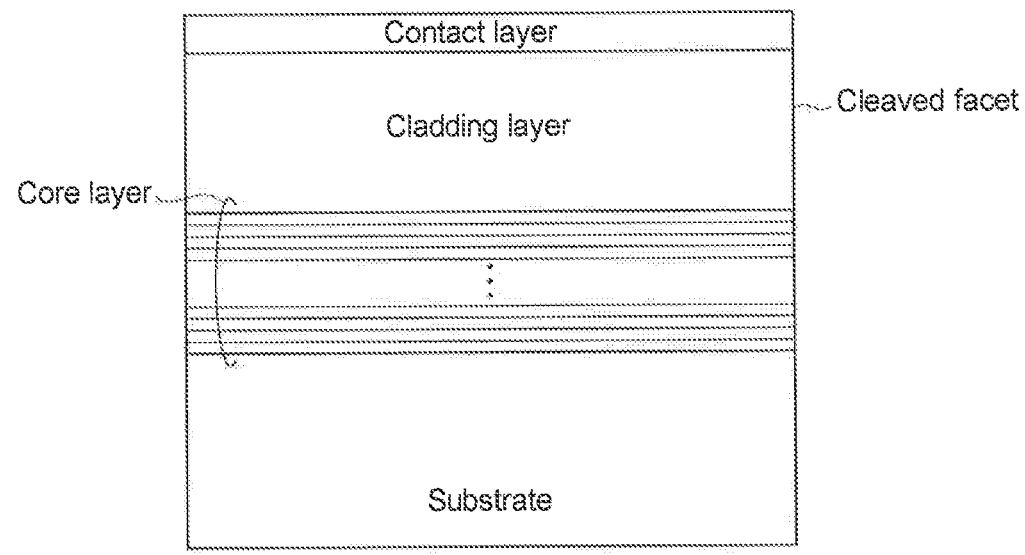
FIG. 6B is a schematic view of a cleaved facet of a quantum cascade laser according to an embodiment of the present invention.

Reflectivity of cleaved facet of similar stacked semiconductor layer illustrated in FIG. 6B without DBRs: 30%.

Reflectivity of DBRs having a similar structure but having no recess portion: 50%.

Light emitted from an end facet of a core layer of a semiconductor mesa to a distributed Bragg reflector diverges toward a transverse direction perpendicular to the longitudinal direction. The light is reflected by the semiconductor walls of the distributed Bragg reflector. When the semiconductor wall has a flat side surface, light reflected from the semiconductor walls is not returned sufficiently to the end facet of the core layer of the semiconductor mesa due to the divergence of light. As a result, the effective reflectivity of the distributed Bragg reflector is decreased, and the optical loss of the laser cavity is increased. The distributed Bragg reflector including the semiconductor walls having a recess portion on a side surface thereof reflects light effectively to the core layer of the semiconductor mesa so as to increase the effective reflectivity of the distributed Bragg reflector.

Although the principle of the present invention is illustrated and described with the preferred embodiments, a person skilled in the art will recognize that arrangements and details in the present invention can be modified without departing from the principle. The present invention should not be limited to the specific structures disclosed in the embodiments. The present invention encompasses all modifications and alterations that fall within the scope and spirit of the appended claims.

What is claimed is:

1. A quantum cascade laser comprising:
a semiconductor region having a main surface including a first region and a second region arranged in a first axis direction;
a stacked semiconductor layer disposed on the second region of the semiconductor region, the stacked semiconductor layer including a core layer and an upper cladding layer disposed on the core layer; and
a distributed Bragg reflector disposed on the first region of the semiconductor region, the distributed Bragg reflector including at least one semiconductor wall having a side surface extending in a second axis direction perpendicular to the main surface of the semiconductor region, the semiconductor wall including the core layer and the upper cladding layer,
wherein the side surface of the semiconductor wall is optically coupled to an end facet of the stacked semiconductor layer, and
the side surface of the semiconductor wall includes a side surface of the core layer having a recess portion depressed from a side surface of the upper cladding layer in the semiconductor wall.

2. The quantum cascade laser according to claim 1, wherein the side surface of the core layer in the semiconductor wall includes a first portion, a second portion, and a third portion that are arranged in the second axis direction, the third portion being disposed between the first and second portions,
the first portion of the core layer in the semiconductor wall has an inclined side surface that is inclined inward from the upper cladding layer toward the semiconductor region,
the second portion of the core layer in the semiconductor wall has an inclined side surface that is inclined outward from the upper cladding layer toward the semiconductor region, and
the third portion of the core layer in the semiconductor wall has a deepest portion of the recess portion.

3. The quantum cascade laser according to claim 1, wherein the side surface of the core layer in the semiconductor wall includes a first portion, a second portion, and a third portion that are arranged in the second axis direction, the third portion being disposed between the first and second portions,
the first portion of the core layer in the semiconductor wall has a side surface having an inverted mesa shape, the second portion of the core layer in the semiconductor wall has a side surface having a normal mesa shape, and
the third portion of the core layer in the semiconductor wall includes a deepest portion of the recess portion.

4. The quantum cascade laser according to claim 1, wherein the recess portion of the core layer in the semiconductor wall has a concave structure configured to converge light reflected by the semiconductor wall toward the end facet of the stacked semiconductor layer.

5. The quantum cascade laser according to claim 1, wherein the core layer has a thickness of 1.5 μm or more.

6. The quantum cascade laser according to claim 1, wherein the core layer includes a multi quantum well structure including an AlInAs layer and an InGaAs layer that are alternately stacked.

7. The quantum cascade laser according to claim 1, further comprising:
   a semiconductor mesa extending in the first axis direction, the semiconductor mesa including the stacked semiconductor layer;
   a first trench and a second trench that define the semiconductor mesa; and
   a first terrace and a second terrace that are extended in the first axis direction,
   wherein the first trench is defined by the first terrace and the semiconductor mesa,
   the second trench is defined by the second terrace and the semiconductor mesa,
   the semiconductor wall is extended in a direction intersecting with the first axis direction, and
   the semiconductor wall has one end connected to the first terrace and the other end connected to the second terrace.

8. The quantum cascade laser according to claim 1, further comprising:
   a semiconductor mesa extending in the first axis direction, the semiconductor mesa including the stacked semiconductor layer; and
   a buried region disposed on side surfaces of the semiconductor mesa so as to embed the semiconductor mesa,
   wherein the semiconductor wall is extended in a direction intersecting with the first axis direction, and
   the semiconductor wall has one end and the other end opposite to the one end that are connected to the buried region.

* * * * *